(12) United States Patent
Matsumoto et al.

(10) Patent No.: US 10,604,838 B2
(45) Date of Patent: Mar. 31, 2020

(54) APPARATUS FOR ATOMIC LAYER DEPOSITION AND EXHAUST UNIT FOR APPARATUS FOR ATOMIC LAYER DEPOSITION

(71) Applicant: THE JAPAN STEEL WORKS, LTD., Shinagawa-ku, Tokyo (JP)

(72) Inventors: Tatsuya Matsumoto, Kanagawa (JP); Keisuke Washio, Kanagawa (JP)

(73) Assignee: THE JAPAN STEEL WORKS, LTD., Tokyo (JP)

( * ) Notice: Subject to any disclaimer, the term of this patent is extended or adjusted under 35 U.S.C. 154(b) by 214 days.

(21) Appl. No.: 15/575,359

(22) PCT Filed: Apr. 19, 2016

(86) PCT No.: PCT/JP2016/062401
§ 371 (c)(1),
(2) Date: Nov. 18, 2017

(87) PCT Pub. No.: WO2016/190006
PCT Pub. Date: Dec. 1, 2016

(65) Prior Publication Data
US 2018/0148837 A1      May 31, 2018

(30) Foreign Application Priority Data
May 26, 2015   (JP) ................................ 2015-106857

(51) Int. Cl.
*C23C 16/40* (2006.01)
*C23C 16/455* (2006.01)
*C23C 16/44* (2006.01)

(52) U.S. Cl.
CPC .... *C23C 16/45544* (2013.01); *C23C 16/4401* (2013.01); *C23C 16/4412* (2013.01); *C23C 16/45502* (2013.01); *C23C 16/45536* (2013.01)

(58) Field of Classification Search
CPC .......... C23C 16/45544; C23C 16/4401; C23C 16/4412; C23C 16/45502; C23C 16/45536
(Continued)

(56) References Cited

U.S. PATENT DOCUMENTS 4,793,283 A    12/1988  Sarkozy
5,044,314 A     9/1991  McNeilly
(Continued)

FOREIGN PATENT DOCUMENTS

CN    101356630 A    1/2009
JP     61163279 A    7/1986
(Continued)

OTHER PUBLICATIONS

Related U.S. Appl. No. 15/575,357; First Named Inventor: Tatsuya Matsumoto; Title: "Device for Atomic Layer Deposition"; filed: Nov. 18, 2017.
(Continued)

*Primary Examiner* — Rudy Zervigon
(74) *Attorney, Agent, or Firm* — Holtz, Holtz & Volek PC

(57) ABSTRACT

An apparatus for atomic layer deposition includes a film deposition chamber, a tubular exhaust pipe connecting section mounted to an outer side of an opening section provided in the film deposition chamber, and a tubular exhaust adhesion preventive member located inside the film deposition chamber and inserted into and mounted on the opening section. The exhaust pipe connecting section is provided with an inert-gas supply passage and an inert-gas supply port, both in the connecting section. The exhaust adhesion preventive member is provided with an inert-gas supply passage formed of a gap between each of an inner peripheral surface of the opening section and an inner wall of the film deposition chamber around the opening section, and the
(Continued)

adhesion preventive member, and an inert-gas discharge port provided in the inert-gas supply passage, and from which the inert gas flows out into the film deposition chamber.

13 Claims, 5 Drawing Sheets

(58) Field of Classification Search
USPC .................. 118/715; 156/345.33, 345.34
See application file for complete search history.

(56) References Cited

U.S. PATENT DOCUMENTS

| | | | |
|---|---|---|---|
| 5,222,074 A | 6/1993 | Uchiyama et al. | |
| 5,326,725 A | 7/1994 | Sherstinsky et al. | |
| 5,338,363 A | 8/1994 | Kawata et al. | |
| 5,405,446 A | 4/1995 | Nakajima et al. | |
| 5,457,298 A | 10/1995 | Nelson et al. | |
| 5,534,073 A | 7/1996 | Kinoshita et al. | |
| 5,567,243 A | 10/1996 | Foster et al. | |
| 5,578,132 A | 11/1996 | Yamaga et al. | |
| 5,632,820 A | 5/1997 | Taniyama et al. | |
| 5,643,394 A | 7/1997 | Maydan et al. | |
| 5,772,770 A | 6/1998 | Suda et al. | |
| 5,788,799 A | 8/1998 | Steger et al. | |
| 5,916,455 A | 6/1999 | Kumagai | |
| 5,922,100 A | 7/1999 | Cain et al. | |
| 5,935,283 A | 8/1999 | Sweeney et al. | |
| 5,972,116 A | 10/1999 | Takagi | |
| 5,992,463 A | 11/1999 | Redemann et al. | |
| 5,997,651 A | 12/1999 | Matsuse et al. | |
| 6,194,037 B1 | 2/2001 | Terasaki et al. | |
| 6,200,389 B1 | 3/2001 | Miller et al. | |
| 6,248,672 B1 | 6/2001 | Takagi | |
| 6,293,310 B1 | 9/2001 | Redemann et al. | |
| 6,410,102 B1* | 6/2002 | Hashizume | C23C 16/4405 118/723 E |
| 6,527,911 B1 | 3/2003 | Yen et al. | |
| 6,733,593 B1 | 5/2004 | Tanaka et al. | |
| 7,354,622 B2 | 4/2008 | Shinriki et al. | |
| 7,635,501 B2 | 12/2009 | Komai et al. | |
| 8,430,960 B2 | 4/2013 | Sumakeris et al. | |
| 8,454,749 B2 | 6/2013 | Li | |
| 8,506,713 B2 | 8/2013 | Takagi | |
| 8,539,908 B2 | 9/2013 | Takagi | |
| 8,764,902 B2 | 7/2014 | Suzuki et al. | |
| 8,851,886 B2 | 10/2014 | Morita et al. | |
| 9,540,731 B2 | 1/2017 | Noorbakhsh et al. | |
| 9,767,993 B2 | 9/2017 | Ishibashi et al. | |
| 9,777,371 B2 | 10/2017 | Coutu et al. | |
| 9,988,717 B2 | 6/2018 | Honma | |
| 10,167,557 B2 | 1/2019 | Hawkins et al. | |
| 2002/0023589 A1 | 2/2002 | Kondo et al. | |
| 2002/0108711 A1 | 8/2002 | Kim | |
| 2002/0122885 A1 | 9/2002 | Ahn | |
| 2002/0168854 A1 | 11/2002 | Tometsuka | |
| 2002/0182876 A1 | 12/2002 | Kawai | |
| 2003/0041802 A1 | 3/2003 | Tanaka et al. | |
| 2003/0124842 A1 | 7/2003 | Hytros et al. | |
| 2003/0132319 A1 | 7/2003 | Hytros et al. | |
| 2003/0136365 A1* | 7/2003 | Komai | C23C 16/4412 123/142.5 R |
| 2003/0150560 A1 | 8/2003 | Kinnard et al. | |
| 2003/0207032 A1 | 11/2003 | Ann et al. | |
| 2003/0213560 A1 | 11/2003 | Wang et al. | |
| 2004/0154537 A1 | 8/2004 | Chon et al. | |
| 2005/0061442 A1 | 3/2005 | Higashiura | |
| 2006/0021574 A1 | 2/2006 | Armour et al. | |
| 2006/0096540 A1 | 5/2006 | Choi | |
| 2006/0174833 A1 | 8/2006 | Yamazaki et al. | |
| 2006/0185590 A1 | 8/2006 | Schaepkens et al. | |
| 2006/0225655 A1 | 10/2006 | Faguet et al. | |
| 2006/0280868 A1 | 12/2006 | Kato et al. | |
| 2007/0022954 A1 | 2/2007 | Iizuka et al. | |
| 2007/0051312 A1 | 3/2007 | Sneh | |
| 2007/0095284 A1 | 5/2007 | Iizuka et al. | |
| 2007/0158026 A1 | 7/2007 | Amikura | |
| 2008/0173366 A1 | 7/2008 | Kwon | |
| 2008/0206987 A1 | 8/2008 | Gelatos et al. | |
| 2008/0261074 A1 | 10/2008 | Shishikura | |
| 2009/0038548 A1 | 2/2009 | Iizuka et al. | |
| 2009/0173444 A1 | 7/2009 | Sago et al. | |
| 2009/0250008 A1 | 10/2009 | Matsushima et al. | |
| 2009/0277389 A1 | 11/2009 | Kakimoto | |
| 2010/0047447 A1 | 2/2010 | Cook | |
| 2010/0186673 A1 | 7/2010 | Tanaka et al. | |
| 2010/0210092 A1 | 8/2010 | You et al. | |
| 2010/0272895 A1 | 10/2010 | Tsuda | |
| 2010/0298738 A1 | 11/2010 | Felts et al. | |
| 2011/0036291 A1 | 2/2011 | Jauhiainen et al. | |
| 2011/0174441 A1 | 7/2011 | Yamashita et al. | |
| 2011/0212625 A1 | 9/2011 | Toyoda et al. | |
| 2011/0303147 A1 | 12/2011 | Tachibana et al. | |
| 2011/0305836 A1 | 12/2011 | Murata et al. | |
| 2012/0031748 A1 | 2/2012 | Ishihara | |
| 2012/0064245 A1 | 3/2012 | Coutu et al. | |
| 2014/0008352 A1 | 1/2014 | Uemura et al. | |
| 2014/0083615 A1 | 3/2014 | Kim et al. | |
| 2014/0090599 A1 | 4/2014 | Saitou | |
| 2014/0209015 A1 | 7/2014 | Yamada et al. | |
| 2014/0239091 A1 | 8/2014 | Huang et al. | |
| 2014/0262034 A1 | 9/2014 | Ishibashi et al. | |
| 2015/0004798 A1 | 1/2015 | Chandrasekharan et al. | |
| 2015/0024609 A1 | 1/2015 | Milligan et al. | |
| 2015/0267299 A1 | 9/2015 | Hawkins et al. | |
| 2016/0148801 A1 | 5/2016 | Yabe et al. | |
| 2017/0101710 A1 | 4/2017 | Chandrasekharan et al. | |
| 2018/0315626 A1 | 11/2018 | Franklin | |
| 2019/0048463 A1 | 2/2019 | Toramaru et al. | |
| 2019/0177842 A1 | 6/2019 | Washio et al. | |
| 2019/0211448 A1 | 7/2019 | Washio et al. | |

FOREIGN PATENT DOCUMENTS

| | | |
|---|---|---|
| JP | 63076880 A | 4/1988 |
| JP | 01183113 A | 7/1989 |
| JP | 06140379 A | 5/1994 |
| JP | 07201754 A | 8/1995 |
| JP | 08186081 A | 7/1996 |
| JP | 09115993 A | 5/1997 |
| JP | 11335849 A | 12/1999 |
| JP | 2000208439 A | 7/2000 |
| JP | 2000243711 A | 9/2000 |
| JP | 2002302770 A | 10/2002 |
| JP | 2003068657 A | 3/2003 |
| JP | 2004339581 A | 12/2004 |
| JP | 2006080148 A | 3/2006 |
| JP | 2006351655 A | 12/2006 |
| JP | 2007281150 A | 10/2007 |
| JP | 2009062579 A | 3/2009 |
| JP | 2010212433 A | 9/2010 |
| JP | 2010212434 A | 9/2010 |
| JP | 2012052221 A | 3/2012 |
| JP | 2012126977 A | 7/2012 |
| JP | 2012175055 A | 9/2012 |
| JP | 2014192379 A | 10/2014 |
| JP | 2015073019 A | 4/2015 |
| JP | 2015073020 A | 4/2015 |
| JP | 2015073021 A | 4/2015 |
| KR | 1020080098687 A | 11/2008 |
| KR | 101028605 B1 | 4/2011 |
| TW | 457524 B | 10/2001 |
| WO | 0042235 A1 | 7/2000 |
| WO | 2007116940 A1 | 10/2007 |

OTHER PUBLICATIONS

Related U.S. Appl. No. 15/575,358; First Named Inventor: Tatsuya Matsumoto; Title: "Device for Atomic Layer Deposition"; filed: Nov. 18, 2017.

Related U.S. Appl. No. 15/575,360; First Named Inventor: Tatsuya Matsumoto; Title: Apparatus for Plasma Atomic Layer Deposition; filed: Nov. 18, 2017.

(56) References Cited

OTHER PUBLICATIONS

International Search Report (ISR) and Written Opinion dated Jun. 21, 2016 issued in International Application No. PCT/JP2016/062401.
English translation of the International Preliminary Report on Patentability dated Dec. 7, 2017 issued in counterpart International Application No. PCT/JP2016/062401.
Notice of Allowance dated Aug. 26, 2019 issued in U.S. Appl. No. 15/575,357.
Notice of Allowance dated Aug. 28, 2019 issued in U.S. Appl. No. 15/575,360.

* cited by examiner

APPARATUS FOR ATOMIC LAYER DEPOSITION AND EXHAUST UNIT FOR APPARATUS FOR ATOMIC LAYER DEPOSITION

TECHNICAL FIELD

The present invention relates to an apparatus for atomic layer deposition for deposition of thin film on a substrate.

BACKGROUND ART

The atomic layer deposition method, in which gases of elements constituting a thin film to be formed are alternately supplied onto a substrate to form a thin film in the unit of atomic layer on the substrate, is known as a technique for uniformly deposition of a thin film. Compared with a common CVD (Chemical Vapor Deposition) method, the atomic layer deposition method excels in step covering property and film thickness controllability.

Repeating the formation of a thin film by the atomic layer deposition method will lead to adhesion of the thin film even on an inner surface of the film deposition chamber. As the thickness of the thin film adhered to the inner surface of the film deposition chamber increases, the deposited thin film becomes peeled off and part of which becomes particles, causing deterioration of the quality of the thin film formed on the substrate. For that reason, it is preferable to remove the thin film adhered on the inner surface of the film deposition chamber at regular intervals.

Patent Literature 1 proposes a processing method and apparatus in which an adhesion preventive plate is used and further deposits deposited on the inner wall of a chamber are covered with an amorphous film in a vapor phase growing apparatus for CVD film deposition, sputter film deposition, and the like.

Further, Patent Literature 2 proposes an ALD (Atomic Layer Deposition) vacuum film deposition apparatus, comprising an exhaust box through which raw material gas discharged from a reaction chamber passes and which includes an adhesion preventive plate inserted thereinto, and a seal mechanism which is provided on an inner wall surface of the exhaust box, and is made up of a hollow seal member, in which the seal mechanism is configured such that, when gas is continuously introduced into the seal member to cause it to expand, the seal member expands toward the inside of the exhaust box, coming into abutment with the surface of the inserted adhesion preventive plate, thus sealing the gap between the inner wall of the exhaust box and the surface of the adhesion preventive plate, and at least one aperture for ejecting the introduced gas is provided in the seal member.

CITATION LIST

Patent Literature

[Patent Literature 1] Japanese Patent Laid-Open No. 2006-351655
[Patent Literature 2] Japanese Patent Laid-Open No. 2014-192379

SUMMARY OF INVENTION

Technical Problem

In Patent Literature 1, it is possible to reduce the frequency of cleaning the apparatus provided it were a conventional vapor phase growing apparatus. However, when the thickness of deposits deposited on the inner wall of the chamber and an amorphous film covering the deposits becomes not less than a predetermined thickness, it is necessary to perform cleaning by using a wet etching method. In the wet etching method, since the film deposition chamber is opened up, the time and effort for the opening work increases as the size of the film deposition chamber increases, and therefore, when a gas etching method can be used, it is preferable to use the gas etching method. However, to perform etching by a gas etching method, it is necessary to heat a portion of the inner wall surface of the film deposition chamber, onto which a thin film has been adhered, to a temperature higher than or equal a predetermined temperature, and a portion apart from the heater may not reach a necessary heating temperature, making it difficult to perform gas etching. For that reason, if a certain amount of thin film has been adhered to a location where it is difficult to perform gas etching, it becomes necessary to open the film deposition chamber and perform wet etching.

In an ALD apparatus, the raw material gas and the reaction gas easily infiltrate into fine gaps, thereby deposition of a film. The gas that has infiltrated into such fine gaps produces a film and powder, thus causing particles. Therefore, by utilizing an adhesion preventive plate and supplying inert gas to the back surface of the adhesion preventive plate, it becomes possible to suppress film adhesion to a film deposition chamber or an exhaust box body, thereby avoiding occurrence of particles. According to the technique of Patent Literature 2, although it is possible to suppress the reaction gas from entering from the downstream side to the upstream side of the exhaust box, it is difficult to suppress the reaction gas from entering from a gap between the film deposition chamber and the exhaust adhesion preventive plate, and a hole of the screw for fixing the adhesion preventive plate so that film and powder will deposit onto an introducing port of the exhaust box on the side of the film deposition chamber, thereby causing particles. Moreover, since suppression of film adhesion is effective in a midstream portion of a trap box, it becomes impossible to avoid film adhesion in the downstream of the trap box in the periphery of the exhaust pipe so that maintenance of the exhaust box becomes necessary as well.

It is one of the objectives of the present invention to provide an apparatus for atomic layer deposition which can reduce the frequency of cleaning of exhaust side, thereby improving maintenance workability, and an exhaust unit thereof.

Solution to Problem

That is, a first aspect of the apparatus for atomic layer deposition of the present invention includes:
a film deposition chamber;
a tubular exhaust pipe connecting section, which is mounted to an outer side of an opening section for exhausting gas provided in the film deposition chamber, whose outer peripheral surface is larger in size than the opening section, and in which an exhaust passage is located on a tube hole side; and
a tubular exhaust adhesion preventive member which is located inside the film deposition chamber and is inserted into and mounted to the opening section, and in which an exhaust passage is located on a tube hole side, wherein
the exhaust pipe connecting section is provided with:
an inert-gas supply passage for connecting section which is partitioned from the exhaust passage and in which inert gas flows; and an inert-gas supply port for connecting section which is provided in the inert-gas supply passage for connecting section, and through which the inert gas flows out to the opening section side, and wherein the exhaust adhesion preventive member is provided with:

an inert-gas supply passage for adhesion preventive member which is partitioned from the exhaust passage, is formed of a gap between each of an inner peripheral surface of the opening-section and an inner wall of the film deposition chamber around the opening section, and the exhaust adhesion preventive member; and an inert-gas discharge port for adhesion preventive member which is provided in the inert-gas supply passage for adhesion preventive member and is in communication with the inert-gas supply port for connecting section, and from which the inert gas flows out into the film deposition chamber.

According to the above described aspect of the present invention, inert gas that flows in the inert-gas supply passage for connecting section flows to the inert-gas supply passage for adhesion preventive member and flows out to the inert-gas discharge port for adhesion preventive member so that occurrence of film adhesion in a gap between the exhaust adhesion preventive member and each of the film deposition chamber inner wall, the opening section, and the exhaust pipe connecting section is suppressed.

In the apparatus for atomic layer deposition of a second aspect of the present invention, the inert-gas discharge port for adhesion preventive member is formed over the entire circumference of the exhaust adhesion preventive member in the above described aspect of the present invention.

According to the above described aspect of the present invention, it is possible to surely prevent occurrence of film adhesion in a gap between the exhaust adhesion preventive member and the film deposition chamber inner wall.

In the apparatus for atomic layer deposition of a third aspect of the present invention, a gap between an inner peripheral surface of the opening section and an outer peripheral surface of the exhaust adhesion preventive member inserted into the opening section is not more than 10 mm in the above described aspect of the present invention.

According to the above described aspect of the present invention, by appropriately securing a gap between the inner peripheral surface of the opening section and the outer peripheral surface of the adhesion preventive member inserted into the opening section, it is made easy to secure the flow of inert gas thereby preventing film adhesion and obtaining a proper flow rate of the gas. This gap is preferably not more than 10 mm. If the above described gap is more than 10 mm, a larger amount of gas will be needed to obtain a proper flow rate of the gas. The gap is more preferably not more than 5 mm. The lower limit of the gap is not particularly limited, and may be any amount provided it allows flowing out of inert gas. Even when components are brought into abutment with each other, if both have rough surfaces, the gap therebetween will allow flowing out of gas. For example, configuration may be such that the outer peripheral surface of the adhesion preventive member is intentionally made up of a rough surface (for example, Ra (arithmetic mean roughness)=3 to 6 μm), and the adhesion preventive member is mounted with the outer peripheral surface of the adhesion preventive member being in abutment with the film deposition chamber. In this point, the lower limit of the gap can be exemplified by 0.01 mm.

In the apparatus for atomic layer deposition of a fourth aspect of the present invention, a gap between the film deposition chamber inner wall around the opening section, and the exhaust adhesion preventive member is not more than 10 mm in the above described aspect of the present invention.

According to the above described aspect of the present invention, a gap between the film deposition chamber inner wall around the opening section and the adhesion preventive member makes it easy to secure flow of inert gas, thereby preventing film adhesion, and achieving a proper flow rate of the gas. When the above described gap is more than 10 mm, a sufficient flow of gas will not be allowed. On the other hand, the lower limit of the gap is not particularly limited, and may be any amount provided that it allows flowing out of gas. Even when components are brought into abutment with each other, if both have rough surfaces, flowing out of gas will be allowed by a gap therebetween. In this point, the lower limit of the gap can be exemplified by not less than 0.001 mm.

In the apparatus for atomic layer deposition of a fifth aspect of the present invention, one or more of the inert-gas supply passage for connecting section are provided along the flow direction of exhaust gas, on the outer peripheral side of the exhaust passage in the above described aspect of the present invention.

According to the above described aspect of the present invention, it is possible to supply inert gas through one or multiple inert-gas supply passages for connecting section. Particularly, when multiple of them are provided, it is possible to supply gas as uniformly as possible. The multiple inert-gas supply passages for connecting section can be provided, for example, at least upward, downward, and both sideward of the exhaust hole.

In the apparatus for atomic layer deposition of a sixth aspect of the present invention, the exhaust adhesion preventive member has an adhesion preventive exhaust pipe which is inserted into a tube hole of the exhaust pipe connecting section and extends along the tube hole; the adhesion preventive exhaust pipe being in communication with the tube hole of the exhaust adhesion preventive member; and the tube hole and a pipe hole of the adhesion preventive exhaust pipe constitute at least a part of the exhaust passage in a lengthwise direction, in the above described aspect of the present invention.

According to the above described aspect of the present invention, placing an adhesion preventive exhaust pipe will allow the gap between the exhaust adhesion preventive member and the exhaust pipe connecting section, and the inner peripheral surface of the exhaust pipe connecting section to be covered, thereby preventing film adhesion.

The apparatus for atomic layer deposition of a seventh aspect of the present invention includes: an inert-gas second supply passage for connecting section reaching a tip end of the adhesion preventive exhaust pipe between the adhesion preventive exhaust pipe and the tube hole of the exhaust pipe connecting section, wherein an inert-gas second supply port for connecting section from which inert gas flows out is provided on a tip end side of the inert-gas second supply passage for connecting section, in the above described aspect of the present invention.

According to the above described aspect of the present invention, the inert-gas second supply passage for connecting section suppresses film adhesion to the tip end side of the adhesion preventive exhaust pipe, and suppresses film adhesion to the exhaust pipe connecting section.

In the apparatus for atomic layer deposition of an eighth aspect of the present invention, the inert-gas second supply passage for connecting section is in communication with the inert-gas supply passage for connecting section in the above described aspect of the present invention.

According to the above described aspect of the present invention, it is possible to feed part of the inert gas, which has been supplied to the inert-gas supply passage for connecting section, to the inert-gas second supply passage for connecting section.

In the apparatus for atomic layer deposition of a ninth aspect of the present invention, an exhaust pipe is connected to the exhaust pipe connecting section in the above described aspect of the present invention.

According to the above described aspect of the present invention, it is possible to convey exhaust gas through the exhaust pipe.

The exhaust pipe may be mountable to the exhaust pipe connecting section, or the exhaust pipe may be connected in one body to the exhaust pipe connecting section.

In the apparatus for atomic layer deposition of a tenth aspect of the present invention, the adhesion preventive exhaust pipe has a length to be inserted into the exhaust pipe connected to the exhaust pipe connecting section, in the above described aspect of the present invention.

According to the above described aspect of the present invention, film adhesion at the exhaust pipe connecting section will be suppressed.

In the apparatus for atomic layer deposition of an eleventh aspect of the present invention, the adhesion preventive exhaust pipe has an adhesion preventive exhaust extension pipe; the adhesion preventive exhaust extension pipe has a length to be inserted into the exhaust pipe; and the adhesion preventive exhaust extension pipe is mountable from a side at which the exhaust pipe is connected, in the above described aspect of the present invention.

According to the above described aspect of the present invention, it is possible to adjust the length of the adhesion preventive exhaust pipe by an extension pipe, which can be easily mounted from the connecting side with the exhaust pipe.

In the apparatus for atomic layer deposition of a twelfth aspect of the present invention, there is a gap between an outer peripheral surface of the adhesion preventive exhaust pipe and an inner peripheral surface of the exhaust pipe, in the above described aspect of the present invention.

According to the above described aspect of the present invention, it is possible to make up a part of the inert-gas supply passage for connecting section by a gap in the width direction between the adhesion preventive exhaust pipe and the exhaust pipe, thereby preventing film adhesion to the connection gap between the adhesion preventive exhaust pipe and the exhaust pipe. As a result, it is possible to suppress film adhesion to the exhaust pipe connecting section.

In the apparatus for atomic layer deposition of a thirteenth aspect of the present invention, the exhaust adhesion preventive member has a flange extending along an inner wall of the film deposition chamber around the opening section and having a gap between itself and the inner wall, and the inert-gas discharge port for adhesion preventive member is provided between a peripheral-edge inner surface of the flange and the film deposition chamber inner wall, in the above described aspect of the present invention.

According to the above described aspect of the present invention, it is possible to discharge inert gas sideward from the periphery of the flange, thereby preventing particles and the like from infiltrating to the inside along the exhaust gas direction.

An exhaust unit for apparatus for atomic layer deposition of the present invention includes:

a tubular exhaust pipe connecting section, which is mounted to an outer side of an opening section for exhausting gas provided in a film deposition chamber, whose outer peripheral surface is larger in size than the opening section, and in which an exhaust passage is located on a tube hole side; and a tubular exhaust adhesion preventive member which is located inside the film deposition chamber and is inserted into and mounted to the opening section, and in which an exhaust passage is located on a tube hole side, wherein the exhaust pipe connecting section is provided with:

an inert-gas supply passage for connecting section which is partitioned from the exhaust passage and in which inert gas flows; and an inert-gas supply port for connecting section which is provided in the inert-gas supply passage for connecting section, and through which the inert gas flows out to the opening section side, and wherein the exhaust adhesion preventive member is provided with:

an inert-gas supply passage for adhesion preventive member which is partitioned from the exhaust passage, is formed of a gap between each of an inner peripheral surface of the opening-section and an inner wall of the film deposition chamber around the opening section, and the exhaust adhesion preventive member and is in communication with the inert-gas supply port for connecting section; and an inert-gas discharge port for adhesion preventive member which is provided in the inert-gas supply passage for adhesion preventive member, and from which the inert gas flows out into the film deposition chamber.

Advantageous Effects of Invention

According to the present invention, it is possible to easily take out an exhaust adhesion preventive member from inside the film deposition chamber, enabling to perform inert-gas purging for the gap between the exhaust adhesion preventive member and the film deposition chamber, and a gap between the exhaust adhesion preventive member and the exhaust pipe connecting section, thus suppressing film deposition onto the film deposition chamber and the exhaust pipe connecting section. This makes it possible to suppress occurrence of particles, and reduce the frequency of cleaning the film deposition chamber and the exhaust pipe connecting section.

DESCRIPTION OF EMBODIMENTS

Embodiment 1

First, referring to FIG. 1, the configuration of the apparatus for atomic layer deposition of the present embodiment will be described.

Figure 1:
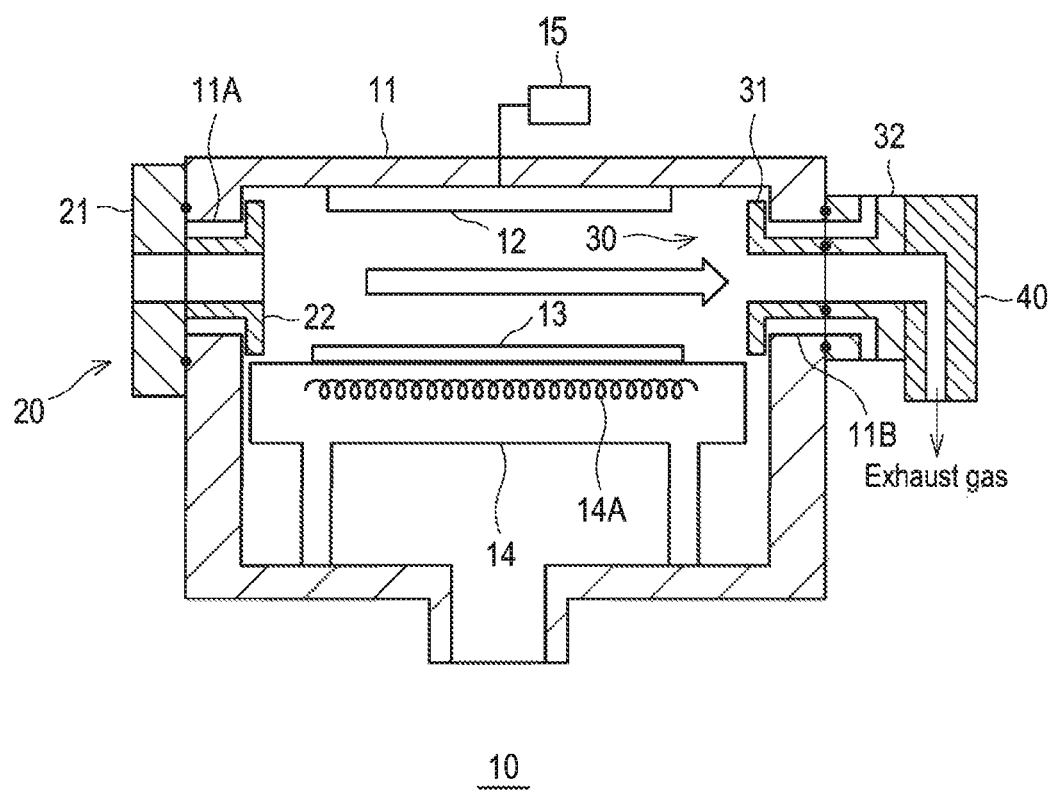
FIG. 1 is a schematic block diagram showing an apparatus for atomic layer deposition of one embodiment of the present invention.

FIG. 1 is a schematic block diagram showing one example of the apparatus for atomic layer deposition of the present embodiment.

The apparatus for atomic layer deposition 10 of the present embodiment alternately supplies raw material gas and reaction gas to form a thin film in the unit of atomic layer on a substrate 13. In this occasion, to improve the reaction activity, the substrate 13 can be heated. Particularly, in the present embodiment, TMA (Tri-Methyl Aluminum) may be used as the raw material gas, and in that occasion, plasma can be generated to improve reaction activity. In the present embodiment, although a parallel plate electrode is used to generate plasma, this scheme is not limiting.

A film deposition chamber 11 includes a gas introducing section 20, an exhaust unit 30, a stage 14 having a heater 14A, an upper electrode 12, and a high-frequency power supply 15. The heater 14A allows for adjusting the temperature of the substrate 13. For example, in the case of the plasma ALD, the substrate 13 can be heated to 50 to 200° C.

The upper electrode 12 is provided so as to be located above the substrate 13 which is placed on the stage 14, and is connected with the high-frequency power supply 15. As a result of the high-frequency power supply 15 supplying high-frequency current of a predetermined frequency, plasma is generated between the upper electrode 12 and the stage 14.

In the film deposition chamber 11, a gas introducing section 20 is provided in an opening section 11A through which gas introduction is performed. In the gas introducing section 20, a tubular injector 21 is disposed outside the film deposition chamber 11, and a tubular injector adhesion preventive member 22 is inserted from inside the film deposition chamber 11 into the opening section 11A and mounted thereto. The injector 21 and the injector adhesion preventive member 22 are provided with a gas passage and are disposed so as to be abutted with each other. The number of the gas passages is not particularly limited.

In the gas introducing section 20, raw material gas, reaction gas, and purge gas are supplied into the film deposition chamber 11.

Moreover, in the film deposition chamber 11, an exhaust unit 30 is provided in the opening section 11b through which gas is discharged. In the exhaust unit 30, a tubular exhaust adhesion preventive member 31 is inserted from inside the film deposition chamber 11 into the opening section 11B and mounted thereto, and a tubular exhaust pipe connecting section 32 is mounted to outside the film deposition chamber 11. An exhaust pipe 40 is connected to the exhaust pipe connecting section 32.

Figure 2A:
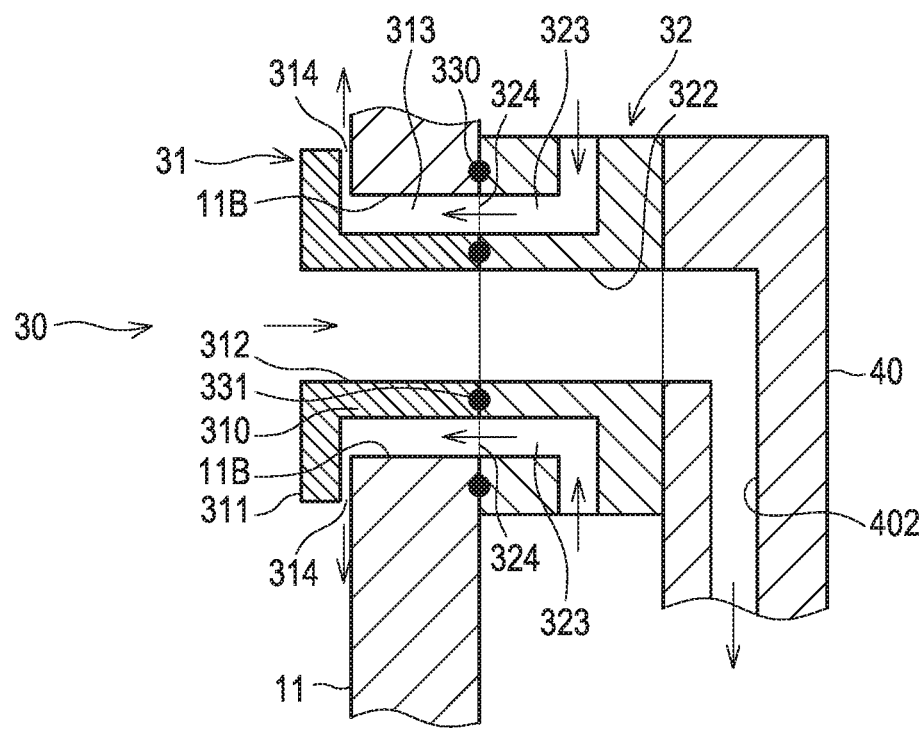
FIG. 2A is an enlarged view of the periphery of an exhaust unit shown in FIG. 1.

FIG. 2A is an enlarged view showing the exhaust unit 30, that is, the exhaust adhesion preventive member 31 and the exhaust pipe connecting section 32, when seen from the side of the film deposition chamber which is parallel with the direction of gas flow.

The opening section 11A and the opening section 11B are formed such that the gas flow of the exhaust adhesion preventive member 31 and the exhaust pipe connecting section 32 is parallel with the face of the substrate 13. That is, the apparatus for atomic layer deposition of the present embodiment is an apparatus of a laminar flow type. However, in the present invention, the apparatus for atomic layer deposition will not be limited to a laminar flow type.

The exhaust adhesion preventive member 31 has, as shown in FIG. 2A, a tube hole 312, and has a flange 311, which has a size larger than the opening section 11B, on the side of the film deposition chamber 11.

The tubular adhesion preventive member body 310 located in the outside of the flange 311 has a gap between itself and the inner peripheral surface of the opening section 11B, over the entire circumference thereof, and the gap constitutes an inert-gas supply passage 313 for adhesion preventive member. The amount of this gap is, though not particularly limited as the present invention, preferably in a range of 0.01 to 5 mm, and determined to be 1 mm in this embodiment.

Moreover, a gap is secured over the entire circumference between the inner surface of the flange 311 and the film deposition chamber 11 inner wall around the opening section 11B, and the gap also constitutes a part of the inert-gas supply passage 313 for adhesion preventive member. The gap between the flange 311 and the film deposition chamber 11 inner wall may be provided intentionally so as to be not more than 10 mm, and may be abutted to the film deposition chamber 11 inner wall if the inner surface of the flange 311 is a rough surface.

For example, the inner surface of the flange 311 may be intentionally configured to be a rough surface (for example, Ra (arithmetic mean roughness)=3 to 6 μm), and the inner surface of the flange 311 may be abutted to the film deposition chamber 11 inner wall and mounted thereto.

This rough surface profile secures the inert-gas supply passage 313 for adhesion preventive member through which gas flows. The inert-gas supply passage 313 for adhesion preventive member preferably has at least not less than 0.001 mm.

The same applies to Embodiment 2 described below.

The gap over the entire circumference between the peripheral-edge inner surface of the flange 311 and the film deposition chamber 11 inner wall constitutes an inert-gas discharge port 314 for adhesion preventive member.

Note that the inert-gas supply passage 313 for adhesion preventive member is partitioned from the tube hole 312 constituting an exhaust hole by the peripheral wall of the adhesion preventive member body 310.

The inert-gas discharge port 314 for adhesion preventive member has a shower head structure as described below in which the inert-gas supply passage 313 for adhesion preventive member is connected to a plurality of inert-gas supply passages 323 for connecting section.

A tubular exhaust pipe connecting section 32 has an outer peripheral shape exceeding the opening section 11B, and a tube hole 322 along the axial direction, and is in communication with the tube hole 312 of the exhaust adhesion preventive member 31. In this embodiment, the tube holes 312 and 322 constitute an exhaust hole. Note that it is also possible that the tube hole itself does not constitute an exhaust hole, but has an exhaust hole in its inner side. The connecting portion between the tube hole 312 and the tube hole 322 is preferably formed to be flush with them.

The exhaust pipe connecting section 32 is mounted to the outer wall of the film deposition chamber 11. In mounting, an O-ring 330 is interposed between the tip end surface of the exhaust pipe connecting section 32 and the outer wall surface of the film deposition chamber 11 to improve sealability. Moreover, the tip end surface of the exhaust adhesion preventive member 31 is located so as to follow the outer wall of the film deposition chamber 11 in a mounted state. As a result, the tip end surface of the exhaust pipe connecting section 32 and the tip end surface of the exhaust adhesion preventive member 31 come into abutment with each other. In this occasion, an O-ring 331 is interposed between the tip end surfaces to improve sealability. An O-ring groove (not shown) for containing the O-ring 331 may be formed only in the exhaust adhesion preventive member 31 for the sake of maintainability.

Figure 2B:
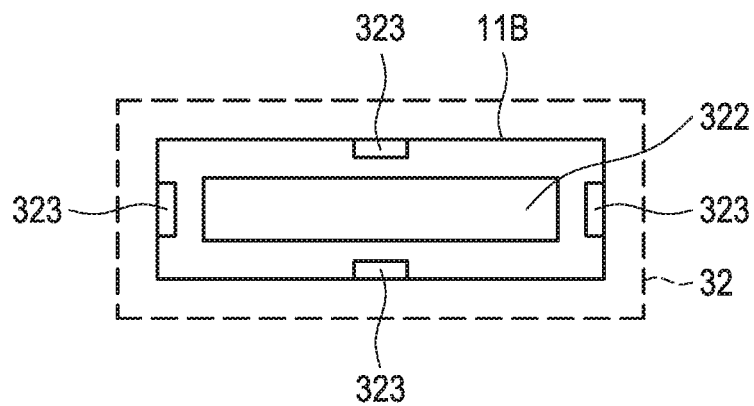
FIG. 2B is an enlarged view of the side of an exhaust pipe connecting section shown in FIG. 1.

Moreover, in the exhaust pipe connecting section 32, as shown in FIG. 2B, an inert-gas supply passage 323 for connecting section is provided on an upper side, lower side, and both side sides respectively around the tube hole 322 such that the hole surface on the outer side lies along the inner peripheral surface of the opening section 11B. FIG. 2B is a diagram showing the exhaust pipe connecting section 32 seen from inside the film deposition chamber, with the exhaust adhesion preventive member 31 being omitted.

The inert-gas supply passage 323 for connecting section is formed along the axial direction of the exhaust pipe connecting section 32 along the flow direction of gas, and changes its direction toward the outer periphery in the middle of the axial direction, eventually opening up in the outer peripheral surface of the exhaust pipe connecting section 32.

Moreover, each of the inert-gas supply passages 323 for connecting section is formed at a position where the hole surface on the outer periphery side lies along the hole surface of the opening section 11B, and communicates with the inert-gas supply passage 313 for adhesion preventive member. The end section where the inert-gas supply passage 323 for connecting section communicates with the inert-gas supply passage 313 for adhesion preventive member constitutes an inert-gas supply port 324 for connecting section. Note that the cross sectional shape of the inert-gas supply passage 323 for connecting section does not need necessarily to lie along the hole surface of the opening section 11B.

The inert-gas supply passage 323 for connecting section is partitioned from the tube hole 322, which constitutes an exhaust hole, by the inner peripheral wall of the exhaust pipe connecting section 32.

The inert-gas supply passage for connecting section is preferably provided at one or more places in the exhaust pipe connecting section. For example, in the case of a cuboid shape such as one whose aspect ratio between the width and the height of the exhaust pipe connecting section is 10:1, the inert-gas supply passage for connecting section is preferably provided in two locations including the upper side and the lower side of the exhaust pipe connecting section and configured to have a shower head structure on the discharge port side. This makes it possible to uniformly supply gas to the inert-gas supply passage for adhesion preventive member or the inert-gas discharge port for adhesion preventive member. Even when the exhaust pipe connecting section has a circular shape, providing inert-gas supply passages in multiple locations will improve pressure uniformity in the inert-gas supply passage for adhesion preventive member or the inert-gas discharge port for adhesion preventive member.

The exhaust pipe connecting section 32 is connected with the exhaust pipe 40 which has an exhaust hole 402 so as to communicate with the tube hole 322.

Due to the above described configuration, the gas to be exhausted from the film deposition chamber 11 is discharged to outside the film deposition chamber 11 through the tube holes 312 and 322, and the exhaust hole 402.

Further, inert gas is supplied from an inert-gas supply section, which is not shown, to the inert-gas supply passage 323 for connecting section; the inert gas is fed to the exhaust adhesion preventive member side through multiple inert-gas supply passages 323 for connecting section; and the inert gas is discharged into the film deposition chamber 11 from the inert-gas discharge port 314 for adhesion preventive member through the inert-gas supply port 324 for connecting section and the inert-gas supply passage 313 for adhesion preventive member. As the inert gas, for example, nitrogen and argon etc. can be used.

The above described discharging of the inert gas suppresses film adhesion in the gap between the exhaust adhesion preventive member 31 and the opening section 11B, and further suppresses film adhesion in the gap between the exhaust pipe connecting section 32 and the exhaust adhesion preventive member 31.

Embodiment 2

Figure 3:
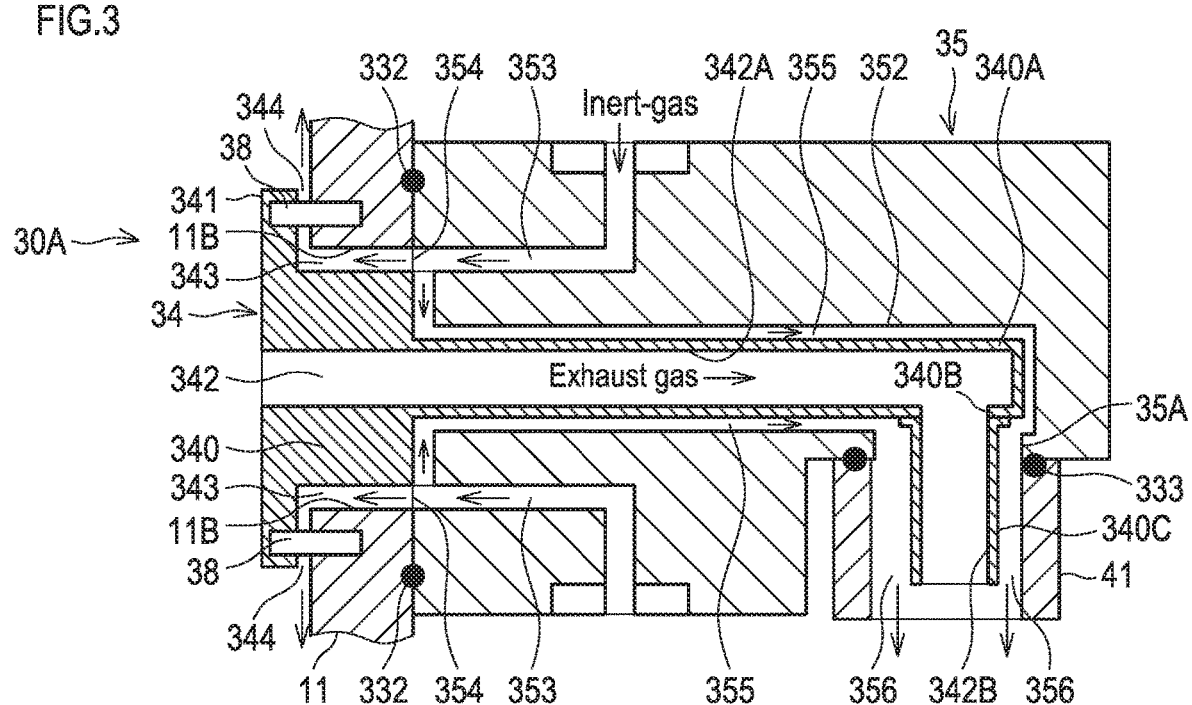
FIG. 3 is an enlarged view of the periphery of an exhaust unit in another embodiment.

Next, another embodiment in which the configuration of the exhaust unit is changed is described based on FIG. 3. Note that the configuration other than the exhaust unit is the same as that of Embodiment 1, and description thereof will be omitted.

The exhaust unit 30A of this embodiment is mounted to the opening section 11B for exhausting gas provided in the film deposition chamber 11 as in Embodiment 1. The exhaust unit 30A has a tubular exhaust adhesion preventive member 34 and a tubular exhaust pipe connecting section 35.

The exhaust adhesion preventive member 34 has a tube hole 342, and has a flange 341 having a size larger than that of the opening section 11B, on the film deposition chamber 11 side.

Fixing of the exhaust adhesion preventive member 34 to the film deposition chamber 11 can be performed for example in such a way that a shim having a thickness of 2 mm is inserted in between the flange 341 and the film deposition chamber 11 inner wall, and is fixed by a screw 38. The screw 38 is used in multiple locations. The number thereof will not be particularly limited.

The tubular adhesion preventive member body 340, which is located on the outer side of the flange 341, has a gap between itself and the inner peripheral surface of the opening section 11B over the entire circumference in the range of axial direction of the opening section 11B, and the gap constitutes the inert-gas supply passage 343 for adhesion preventive member. The amount of this gap is, though not particularly limited as the present invention, preferably in a range of 0.01 to 5 mm. It is determined to be 1 mm in this embodiment.

Moreover, a gap is secured over the entire circumference between the inner surface of the flange 341 and the film deposition chamber 11 inner wall around the opening section 11B, and the gap also constitutes a part of the inert-gas supply passage 343 for adhesion preventive member. The gap between the flange 341 and the film deposition chamber 11 inner wall may be provided intentionally, for example, in an amount of not more than 10 mm, and if the inner surface of the flange 341 is a rough surface, it may be abutted to the film deposition chamber 11 inner wall. This rough surface profile secures the inert-gas supply passage 343 for adhesion preventive member through which gas flows. The inert-gas supply passage 343 for adhesion preventive member preferably has not less than 0.001 mm.

The gap over the entire circumference between the peripheral-edge inner surface of the flange 341 and the film deposition chamber 11 inner wall constitutes the inert-gas discharge port 344 for adhesion preventive member.

The inert-gas supply passage 343 for adhesion preventive member is partitioned from the tube hole 342 by a peripheral wall of the tubular adhesion preventive member body 340.

Note that the inert-gas discharge port 344 for adhesion preventive member has, as will be described below, a shower head structure in which the inert-gas supply passage 343 for adhesion preventive member is connected to multiple inert-gas supply passage 353 for connecting section.

Further, the exhaust adhesion preventive member 34 has an adhesion preventive exhaust pipe 340A which extends outward in the axial direction in line with the inner peripheral side of the exhaust adhesion preventive member body 340, and the pipe hole 342A is in communication with the tube hole 342.

On the other hand, the tubular exhaust pipe connecting section 35 has an outer peripheral shape larger than the opening section 11B, and a tube hole 352 along the axial direction.

The exhaust pipe connecting section 35 is mounted to the outer wall of the film deposition chamber 11, and upon mounting thereof, an O-ring 332 is interposed between the tip end surface of the exhaust pipe connecting section 35 and the outer wall surface of the film deposition chamber 11 to improve sealability. Moreover, the tip end surface of the exhaust adhesion preventive member 34 is located so as to follow the outer wall surface of the film deposition chamber after the mounting. This will result in that the tip end surface of the exhaust pipe connecting section 35 and the tip end surface of the exhaust adhesion preventive member 34 come into abutment with each other.

Moreover, in the exhaust pipe connecting section 35, an inert-gas supply passage 353 for connecting section is formed respectively in its upper side, lower side, and both side sides, on the side of the exhaust adhesion preventive member 34 around the outer peripheral side of the tube hole 352. The inert-gas supply passage 353 for connecting section is formed along the axial direction of the exhaust pipe connecting section 35 along the flow direction of gas, and changes its direction to the outer peripheral direction at a position close to the front in the axial direction, eventually opening up in the outer peripheral surface of the exhaust pipe connecting section 35.

Moreover, each inert-gas supply passage 353 for connecting section is formed at a position where the hole surface on the outer peripheral side lies along the hole surface of the opening section 11B, and is in communication with the inert-gas supply passage 343 for adhesion preventive member. The end section at which the inert-gas supply passage 353 for connecting section communicates with the inert-gas supply passage 343 for adhesion preventive member constitutes an inert-gas supply port 354 for connecting section. Note that the cross sectional shape of the inert-gas supply passage 353 for connecting section does not necessarily need to lie along the hole surface of the opening section 11B.

The inert-gas supply passage 353 for connecting section is partitioned from the tube hole 342 constituting the exhaust hole by the peripheral wall of the exhaust pipe connecting section 35 and the adhesion preventive exhaust pipe 340A.

In the exhaust pipe connecting section 35, the tube hole 352 is closed at the outer end of the exhaust pipe connecting section 35 and communicates from sideward with a mounting hole 35A made in the side.

In the tube hole 352, the adhesion preventive exhaust pipe 340A extends to immediately before reaching an end edge leaving a small gap, and the end edge is closed, and near the end edge, an interconnecting hole 340B oriented toward the mounting hole 35A is formed on the side of the adhesion preventive exhaust pipe 340A.

A gap is provided between the outer peripheral surface of the adhesion preventive exhaust pipe 340A and the inner peripheral surface of the tube hole 352 of the exhaust pipe connecting section 35, and the gap constitutes an inert-gas second supply passage 355 for connecting section.

The inert-gas second supply passage 355 for connecting section has an interconnecting passage which communicates with the inert-gas supply passage 353 for connecting section at a tip end on the film deposition chamber side and a contact surface section contacting with the exhaust adhesion preventive member 34, of the exhaust pipe connecting section 35.

The ratio of total gas conductance between the inert-gas supply passage 343 for adhesion preventive member and the inert-gas second supply passage 355 for connecting section is preferably 0.01 to 100, and is more preferably 1:1. This is for the purpose of supplying an equal amount of inert gas to the film deposition chamber 11 side and the exhaust pipe 41 side. The gas conductance can be controlled by the flow passage width and the flow passage length of the inert-gas supply passage.

Further, the exhaust pipe 41 is mounted to the mounting hole 35A, and an O-ring 333 is interposed between joining surfaces of the both, thereby improving sealability. In the adhesion preventive exhaust pipe 340A, an adhesion preventive exhaust extension pipe 340C extending in the direction of the exhaust pipe 41 is connected to the interconnecting hole 340B. The adhesion preventive exhaust extension pipe 340C can be easily mounted through the mounting hole 35A from the mounting side of the exhaust pipe 41 with the exhaust pipe 41 being dismounted from the exhaust pipe connecting section 35. The pipe hole 342B of the adhesion preventive exhaust extension pipe 340C is in communication with the pipe hole 342A and the tube hole 342.

A gap is secured between the outer peripheral surface of the adhesion preventive exhaust extension pipe 340C, and each of the tube hole 352 inner peripheral surface, the mounting hole 35A inner peripheral surface, and the exhaust pipe 41 inner peripheral surface, and the above described inert-gas second supply passage 355 for connecting section extends to those gaps. The inert-gas second supply passage 355 for connecting section, which is located at a tip end position of the adhesion preventive exhaust extension pipe 340C, constitutes an inert-gas second supply port 356 for connecting section.

The exhaust pipe 41 can utilize, for example, a pipe having an inner diameter of 150 mm. In this case, the adhesion preventive exhaust extension pipe 340C can utilize, for example, a cylinder having an inner diameter of 100 mm and a height of 100 mm, and preferably has a flange so as to be fixable to the adhesion preventive exhaust pipe 340A with a screw. The mounting of the adhesion preventive exhaust extension pipe 340C becomes possible after the adhesion preventive exhaust pipe 340A is mounted to the opening section 11B side of the film deposition chamber, and after the exhaust pipe 41 is dismounted.

According to the above described configuration, the gas exhausted from the film deposition chamber 11 is discharged to the outside of the film deposition chamber 11 through the tube hole 342, and the pipe holes 342A and 342B. The tube hole 342, and the pipe holes 342A and 342B constitute an exhaust hole.

Inert-gas is supplied from an inert-gas supply section not shown to the inert-gas supply passage 353 for connecting section, and the inert-gas is fed to the exhaust adhesion preventive member side through multiple inert-gas supply passages 353 for connecting section, and the inert-gas is discharged into the film deposition chamber 11 from the inert-gas discharge port 344 for adhesion preventive member through the inert-gas supply port 354 for connecting section and the inert-gas supply passage 343 for adhesion preventive member. As the inert gas, for example, nitrogen and argon etc. can be used.

The above described discharging of the inert-gas suppresses film adhesion in gaps to the exhaust adhesion preventive member 34, the opening section 11B, and the exhaust pipe connecting section 35. Moreover, the tube hole side of the exhaust pipe connecting section 35 is covered with the adhesion preventive exhaust pipe 340A, thereby preventing film adhesion.

Further, part of the inert-gas which has been fed to the inert-gas supply passage 353 for connecting section is fed to the inert-gas second supply passage 355 for connecting section, and is discharged from the tip end of the adhesion preventive exhaust extension pipe 340C along the pipeline direction of the exhaust pipe 41 through the periphery of the gap between the adhesion preventive exhaust pipe 340A and the connecting section with the adhesion preventive exhaust extension pipe 340C, and the periphery of the gap between the exhaust pipe connecting section 35 and the connecting section with the exhaust pipe 41.

The above described discharging of the inert-gas makes it possible to suppress film adhesion in a gap between the adhesion preventive exhaust pipe 340A and the exhaust pipe connecting section 35, and a gap between the adhesion preventive exhaust pipe 340A and the extension pipe 340C.

As a result of this, it is possible to make the opening section 11B and the exhaust pipe connecting section 35 maintenance free.

Next, processing procedures in the above described apparatus for atomic layer deposition 10 will be described.

Figure 4:
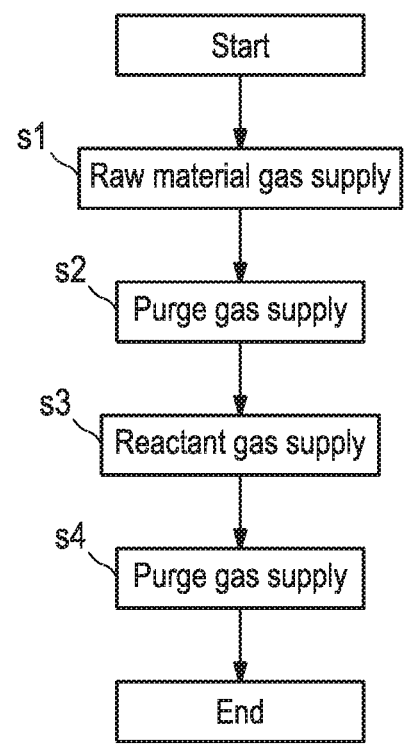
FIG. 4 is a flow chart similarly showing one example of the atomic layer deposition method.

FIG. 4 is a flowchart to show one example of the atomic layer deposition method of the present embodiment. FIGS. 5A to 5D are each a diagram showing steps in which a thin film is formed on a substrate S.

Figure 5A:
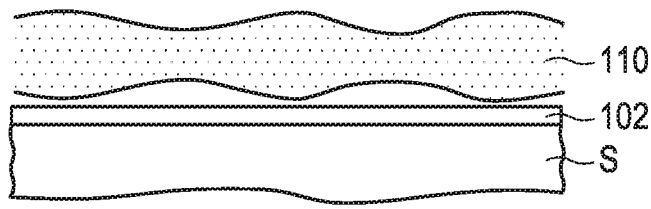
FIGS. 5A, 5B, 5C, and 5D are each a diagram similarly showing steps of deposition of a thin film on a substrate.

First, the raw-material gas supply section supplies raw material gas into the film deposition chamber 11 (step s1). Specifically, it supplies the raw material gas to the gas introducing section 20 (step s1). The raw material gas is supplied into the film deposition chamber 11. The raw material gas is supplied into the film deposition chamber 11, for example, for 0.1 seconds. As shown in FIG. 5A, a raw material gas 110 is supplied into the film deposition chamber 11 by step s1, and the raw material gas 110 adsorbs onto a substrate S, thereby deposition of an adsorption layer 102.

Moreover, in step s1, inert-gas is supplied to the inner surface of the injector 21 and the outer surface of the injector adhesion preventive member 22. Moreover, in the exhaust unit 30, inert-gas is supplied to the exhaust pipe connecting section and the exhaust adhesion preventive member as well.

In the present embodiment, inert-gas is always supplied not only in step s1, but including steps s2 to s4 described below. For that reason, in step s1, when a raw material gas is supplied into the film deposition chamber 11, it is possible to suppress the raw material gas from entering the gap between the film deposition chamber 11 and the injector adhesion preventive member 22, and the gap between the film deposition chamber 11 and the exhaust adhesion preventive member 31.

Next, the supply of raw material gas is stopped, and purge gas is supplied in the gas introducing section (step s2). The purge gas is supplied into the film deposition chamber 11. The raw material gas is discharged from the exhaust unit 30 to the outside of the film deposition chamber 11.

Figure 5B:
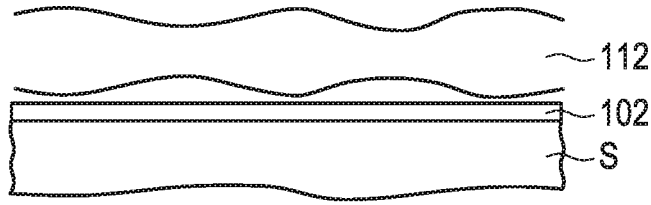

The purge gas is supplied into the film deposition chamber 11, for example, for 0.1 seconds. The exhaust unit 30 exhausts the raw material gas 110 and the purge gas 112 within the film deposition chamber 11. The exhaust unit 30 exhausts the raw material gas 110 and the purge gas 112 within the film deposition chamber 11, for example, for 2 seconds. As shown in FIG. 5B, by step s2, the purge gas 112 is supplied into the film deposition chamber 11, and the raw material gas 110 which has not adsorbed to the substrate S is purged out of the film deposition chamber 11.

Figure 5C:
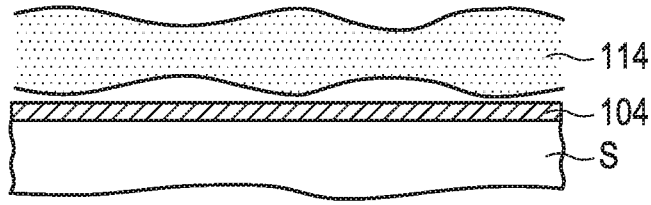

Next, reaction gas is supplied into the film deposition chamber 11 (step s3). Specifically, reaction gas is supplied through the gas introducing section 20 (step s3). The reaction gas is supplied into the film deposition chamber 11 through the passage of the gas introducing section 20. The reaction gas is supplied into the film deposition chamber 11, for example, for one second. As shown in FIG. 5C, by step s3, the reaction gas 114 is supplied into the film deposition chamber 11.

Moreover, in step s3 as well, inert gas is supplied to the inner surface of the injector 21 and the outer surface of the injector adhesion preventive member 22, and the exhaust unit 30. For that reason, in step s3, when supplying reaction gas into the film deposition chamber 11, it is possible to suppress the reaction gas from entering into the gap between the film deposition chamber 11 and the injector adhesion preventive member 22, and the gap between the film deposition chamber 11 and the exhaust adhesion preventive member 31.

Figure 5D:
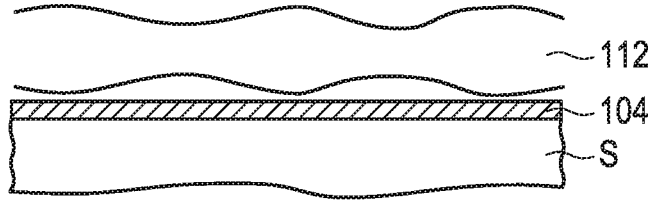

Next, supply of reaction gas is stopped, and purge gas is supplied to the gas introducing section 20 (step s4). The purge gas is supplied into the film deposition chamber 11. The purge gas is discharged to the outside of the film deposition chamber 11 from the exhaust unit 30. The purge gas is, for example, supplied into the film deposition chamber 11, for example, for 0.1 seconds. The exhaust unit 30 exhausts the reaction gas 114 and the purge gas 112 within the film deposition chamber 11. As shown in FIG. 5D, by step s4, purge gas 112 is supplied into the film deposition chamber 11, and reaction gas 114 is purged from the film deposition chamber 11.

As described so far, by steps s1 to s4, a thin film layer 104 of one atomic layer is formed on the substrate S. Hereafter, by repeating steps s1 to s4 for predetermined times, it is possible to form a thin film layer 104 having a desired film thickness.

In the apparatus for atomic layer deposition 10 of the present embodiment, since the inert gas flows on the inner surface of the injector 21 and the outer surface of the injector adhesion preventive member 22, it is possible to suppress the raw material gas and the reaction gas from entering the gap between the film deposition chamber 11 and the injector 21. For that reason, it is possible to suppress a thin film from adhering in the gap between the film deposition chamber 11 and the injector 21. Moreover, adhesion of thin film onto the exhaust unit 30 is also prevented.

Moreover, for example, alumina film, which is formed by using TMA as the raw material gas, and $O_3$ as the reaction gas, can be gas-etched by $BCl_3$ gas. To perform gas etching of an alumina film with $BCl_3$ gas, it is necessary to heat it to, for example, a high temperature of about 500° C.

It becomes possible to heat the inner wall of the film deposition chamber 11, which is located near the heater 14A, to a high temperature of about 500° C. by the heater 14A. For that reason, it becomes possible to remove the thin film adhered to the inner wall of the film deposition chamber 11 which is located near the heater 14A by gas etching.

As described so far, according to the present embodiment, since it is possible to suppress a thin film from adhering to the inner wall of the film deposition chamber 11, and also remove the thin film adhered to the inner wall by gas etching, it is possible to reduce the frequency of cleaning by wet etching.

Example 1

By using the structure of the film deposition chamber 11 of Embodiment 1 and the exhaust unit 30A shown in FIG. 3, an AlON thin film was formed on a G2 glass substrate of 370 mm×470 mm. TMA (trimethyl aluminum) was used as liquid raw material (Al source), and oxygen plasma and nitrogen plasma as the reaction gas. Film deposition was performed by a sequence shown in FIG. 4. The inert gas was constantly supplied during the film deposition sequence at a flow rate of 500 sccm (80° C.)

After film deposition of 20 μm is performed, film thicknesses of inner walls of the exhaust adhesion preventive member and the exhaust pipe connecting section corresponding to portions of the inert-gas supply passage for adhesion preventive member, the inert-gas supply passage for connecting section, and the inert-gas second supply passage for connecting section were visually observed to confirm that no interference film of AlON thin film which is visually observable was observed, and thus the amount of deposition thereof was not more than 50 nm. Maintenance of the exhaust unit was required only for the exhaust adhesion preventive member and screws, the exhaust pipe, and the adhesion preventive exhaust extension pipe, and it became possible to make the opening section and the exhaust pipe connecting section maintenance free.

So far, although the present invention has been described based on the above described embodiments, appropriate modification may be made to the present embodiment as long as it does not deviate from the scope of the present invention.

The present application claims the priority of Japanese Patent Application No. 2015-106857 filed on May 26, 2015 in Japan, which is herein incorporated in its entirety by reference.

REFERENCE SIGNS LIST

10 Apparatus for atomic layer deposition
11 Film deposition chamber
11A Opening section
11B Opening section
13 Substrate
14 Stage
14A Heater
15 High-frequency power supply
20 Gas introducing section
21 Injector
22 Injector adhesion preventive member
30 Exhaust unit
30A Exhaust unit
31 Exhaust adhesion preventive member
32 Exhaust pipe connecting section
34 Exhaust adhesion preventive member
35 Exhaust pipe connecting section
35A Mounting hole
38 Screw
40 Exhaust pipe
41 Exhaust pipe
310 Adhesion preventive member body
311 Flange
312 Tube hole
322 Tube hole
313 Inert-gas supply passage for adhesion preventive member
314 Inert-gas discharge port for adhesion preventive member
323 Inert-gas supply passage for connecting section
324 Inert-gas supply port for connecting section
330 O-ring
331 O-ring
332 O-ring
333 O-ring
340A Adhesion preventive exhaust pipe
340B Interconnecting hole
340C Adhesion preventive exhaust extension pipe
341 Flange
342 Tube hole
342A Pipe hole
342B Pipe hole
343 Inert-gas supply passage for adhesion preventive member
344 Inert-gas discharge port for adhesion preventive member
352 Tube hole
353 Inert-gas supply passage for connecting section
354 Inert-gas supply port for connecting section
355 Inert-gas second supply passage for connecting section
356 Inert-gas second supply port for connecting section
S Substrate
102 Adsorption layer
104 Thin film layer
110 Raw material gas
112 Purge gas
114 Reaction gas

The invention claimed is:

1. An apparatus for atomic layer deposition comprising:
a film deposition chamber having an opening section for exhausting gas;
a tubular exhaust pipe connecting section, which is mounted to an outer side of the opening section for exhausting gas, and which has an outer peripheral surface that is larger in size than the opening section; and
a tubular exhaust adhesion preventive member which is located inside the film deposition chamber and is inserted into and mounted to the opening section,
wherein an exhaust passage extends through the exhaust adhesion preventive member and the exhaust pipe connecting section,
wherein the exhaust pipe connecting section is provided with: (i) an inert-gas supply passage for connecting section which is partitioned from the exhaust passage and which is configured to have inert gas flow therein, and (ii) an inert-gas supply port for connecting section which is provided in the inert-gas supply passage for connecting section, and which is configured to have the inert gas flow out therefrom to the opening section,
wherein the exhaust adhesion preventive member is provided with: (i) an inert-gas supply passage for adhesion preventive member which is partitioned from the exhaust passage, is formed by a gap between the exhaust adhesion preventive member and each of an inner peripheral surface of the opening section and an inner wall of the film deposition chamber around the opening section, and is in communication with the inert-gas supply port for connecting section, and (ii) an inert-gas discharge port for adhesion preventive member which is provided in the inert-gas supply passage for adhesion preventive member, and which is configured to have the inert gas flow out therefrom into the film deposition chamber,
wherein the exhaust adhesion preventive member includes an adhesion preventive exhaust pipe which is inserted into a tube hole of the exhaust pipe connecting section and extends along the tube hole, the adhesion preventive exhaust pipe being in communication with a tube hole of the exhaust adhesion preventive member, and
wherein the tube hole of the exhaust adhesion preventive member and a pipe hole of the adhesion preventive exhaust pipe constitute at least a part of the exhaust passage in a lengthwise direction.

2. The apparatus for atomic layer deposition according to claim 1, wherein the inert-gas discharge port for adhesion preventive member is formed over an entire circumference of the exhaust adhesion preventive member.

3. The apparatus for atomic layer deposition according to claim 1, wherein the gap between the inner peripheral surface of the opening section and an outer peripheral surface of the exhaust adhesion preventive member inserted into the opening section is within a range of 0.01 to 5 mm.

4. The apparatus for atomic layer deposition according to claim 1, wherein the gap between the inner wall of the film deposition chamber inner wall around the opening section and the exhaust adhesion preventive member is not more than 10 mm.

5. The apparatus for atomic layer deposition according to claim 1, wherein one or more of the inert-gas supply passage for connecting section are provided along a flow direction of exhaust gas on an outer peripheral side of the exhaust passage.

6. The apparatus for atomic layer deposition according to claim 1, further comprising:
an inert-gas second supply passage for connecting section reaching a tip end of the adhesion preventive exhaust pipe between the adhesion preventive exhaust pipe and the tube hole of the exhaust pipe connecting section,
wherein an inert-gas second supply port for connecting section which is configured to have inert gas flow out therefrom is provided on a tip end side of the inert-gas second supply passage for connecting section.

7. The apparatus for atomic layer deposition according to claim 6, wherein the inert-gas second supply passage for connecting section is in communication with the inert-gas supply passage for connecting section.

8. The apparatus for atomic layer deposition according to claim 1, wherein an exhaust pipe is connected to the exhaust pipe connecting section.

9. The apparatus for atomic layer deposition according to claim 8, wherein the adhesion preventive exhaust pipe has a length to be inserted into the exhaust pipe connected to the exhaust pipe connecting section.

10. The apparatus for atomic layer deposition according to claim 9, wherein:

the adhesion preventive exhaust pipe is extended by connection of an adhesion preventive exhaust extension pipe;
the adhesion preventive exhaust extension pipe has a length to be inserted into the exhaust pipe; and
the adhesion preventive exhaust extension pipe is mountable from a side at which the exhaust pipe is connected.

11. The apparatus for atomic layer deposition according to claim 9, wherein there is a gap between an outer peripheral surface of the adhesion preventive exhaust pipe and an inner peripheral surface of the exhaust pipe.

12. The apparatus for atomic layer deposition according to claim 1, wherein the exhaust adhesion preventive member has a flange extending along the inner wall of the film deposition chamber around the opening section and having a gap between itself and the inner wall, and the inert-gas discharge port for adhesion preventive member is provided between a peripheral-edge inner surface of the flange and the inner wall of the film deposition chamber.

13. An exhaust unit for an apparatus for atomic layer deposition comprising:
a tubular exhaust pipe connecting section, which is mounted to an outer side of an opening section for exhausting gas provided in a film deposition chamber, and which has an outer peripheral surface that is larger in size than the opening section;
a tubular exhaust adhesion preventive member which is located inside the film deposition chamber and is inserted into and mounted to the opening section,
wherein an exhaust passage extends through the exhaust adhesion preventive member and the exhaust pipe connecting section,
wherein the exhaust pipe connecting section is provided with: (i) an inert-gas supply passage for connecting section which is partitioned from the exhaust passage and which is configured to have inert gas flow therein, and (ii) an inert-gas supply port for connecting section which is provided in the inert-gas supply passage for connecting section, and which is configured to have the inert gas flow out therefrom to the opening section,
wherein the exhaust adhesion preventive member is provided with: (i) an inert-gas supply passage for adhesion preventive member which is partitioned from the exhaust passage, is formed by a gap between the exhaust adhesion preventive member and each of an inner peripheral surface of the opening section and an inner wall of the film deposition chamber around the opening section, and is in communication with the inert-gas supply port for connecting section, and (ii) an inert-gas discharge port for adhesion preventive member which is provided in the inert-gas supply passage for adhesion preventive member, and which is configured to have the inert gas flow out therefrom into the film deposition chamber.

* * * * *